United States Patent [19]
Kato et al.

[11] Patent Number: 5,323,952
[45] Date of Patent: Jun. 28, 1994

[54] BONDING APPARATUS AND TESTING APPARATUS OF A BONDED PORTION

[75] Inventors: Mituo Kato, Hitachiota; Ryoichi Kajiwara, Hitachi; Kazuya Takahashi, Katsuta; Setuo Sekine, Yokohama; Tokiyuki Seto, Odawara, all of Japan

[73] Assignee: Hitachi, Ltd., Tokyo, Japan

[21] Appl. No.: 946,627

[22] Filed: Sep. 18, 1992

[30] Foreign Application Priority Data

Sep. 18, 1991 [JP] Japan ................................. 3-238272

[51] Int. Cl.⁵ .............................................. H01L 21/60
[52] U.S. Cl. .................................. 228/102; 228/180.5; 228/4.5; 228/9
[58] Field of Search ............... 228/102, 103, 105, 179, 228/236, 1.1, 4.5, 9, 44.7; 156/73.1, 73.2, 360, 378, 580.1

[56] References Cited

U.S. PATENT DOCUMENTS

| | | | |
|---|---|---|---|
| 4,603,802 | 8/1986 | Kurtz et al. | 228/102 |
| 4,619,396 | 10/1986 | Yamamoto | 228/102 |
| 4,789,093 | 12/1988 | Bansemir | 228/105 |
| 4,817,848 | 4/1989 | Gabaldon | 228/1.1 |
| 4,998,664 | 3/1991 | Gibson et al. | 228/102 |

FOREIGN PATENT DOCUMENTS

| | | | |
|---|---|---|---|
| 65146 | 3/1990 | Japan | 228/102 |
| 0933333 | 6/1982 | U.S.S.R. | 228/102 |

*Primary Examiner*—Samuel M. Heinrich
*Attorney, Agent, or Firm*—Antonelli, Terry, Stout & Kraus

[57] ABSTRACT

A bonding apparatus comprising a bonding tool, means for driving the bonding tool, means for detecting an amount of crushing of a bonding portion during bonding, means for calculating a rate of change of the amount of crushing detected by the amount-of-crushing detecting means, means for setting a target value, which is inputted from an external source, of the amount of crushing of the bonding portion, and means for controlling the driving means. When the rate of change of the amount of crushing calculated by the calculating means is smaller than a predetermined value, the controlling means compares the amount of crushing detected by the amount-of-crushing detecting means with the target value. When the amount of crushing detected by the amount-of-crushing detecting means is smaller than the target value, the controlling means discriminates that the bonding is being performed in a satisfactory manner and hence should be continued.

10 Claims, 9 Drawing Sheets

BONDING APPARATUS AND TESTING APPARATUS OF A BONDED PORTION

BACKGROUND OF THE INVENTION

1. Field of the Invention

This invention relates to a method and apparatus for bonding lead wires or the like to pads and terminals of electronic elements and semiconductor devices, and to a method and apparatus for testing a bonded portion. More particularly, the invention relates to the bonding of a magnetic head, an LED, an EL, a liquid crystal, a thermosensitive head, etc.

2. Description of the Related Art:

According to the conventional technology, lead wires are connected to pads and terminals of electronic elements and semiconductor devices by soldering (including the reflow method), ultrasonic joining, hot pressing or resistance coupling. As one of the ultrasonic joining methods, ultrasonic bonding (wedge or ball) was particularly popular. In the joints of lead wires with pads and terminals of electronic elements and semiconductor devices, it is important to secure good quality and reliability; consequently, attempts have been made to develop a high-quality and high-reliability bonding technology.

To this end, there have been proposed various kinds of means for discriminating whether or not the individual bonded portion is good. This prior art is exemplified by: the concept of detecting a high-frequency current waveform from an ultrasonic generator and discriminating, by the current intensity and waveform, whether or not the bonded portion is good, as disclosed in Japanese Patent Laid-Open Publications Nos. SHO 61-237438, SHO 61-237440 and SHO 62-76731; the concept of detecting and discriminating an abnormality when the output and the vibrating time of an ultrasonic generator are outside the respective predetermined ranges, as disclosed in Japanese Patent Laid-Open Publication No. SHO 61-294830; and the concept of measuring the vibration of a bonding tool, by monitoring the ultrasonic wave during bonding, to detect a bonding status, as disclosed in Japanese Patent Laid-Open Publication No. SHO 62-293731.

Further, various high-reliability bonding methods and apparatuses have been proposed. This prior art is exemplified by: a bonding method in which the temperature of a lead wire heated by heat or light rays is measured by a non-contact thermometer, as disclosed in Japanese Patent Laid-Open Publication No. SHO 63-232438; a bonding method in which the position of a bonding tool is detected and then the movement of the bonding tool is controlled, as disclosed in Japanese Patent Laid-Open Publication No. SHO 63-257238; a bonding method in which the load during bonding is varied and controlled, as disclosed in Japanese Patent Laid-Open Publication No. HEI 1-129430; a bonding method in which the ultrasonic frequency and output are varied and controlled, depending on the bonding manner and position, as disclosed in Japanese Patent Laid-Open Publication No. HEI 1-184841; and a bonding method in which attenuation of ultrasonic vibration of a bonding tool is measured and the ultrasonic vibration is stopped when it becomes normal, as disclosed in Japanese Patent Laid-Open Publication No. HEI 2-156548.

Meanwhile, in testing and evaluating a bonding portion after it has been bonded, it is a common practice to observe the bonding portion with visual inspection by an operator. This prior art is exemplified by: the concept of detecting the width of bonding of a bonding portion and discriminating, by the detected width, whether or not the bonded portion is good as disclosed in Japanese Patent Laid-Open Publication No. SHO 55-59731; the concept of converting pictures, which are photographed by a low-magnification camera and a high-magnification camera, into binary images and detecting deviation of bonding, the diameter of a ball, the shape of a ball and peeling, as disclosed also in Japanese Patent Laid-Open Publication No. SHO 55-59731; and a semiconductor device which discriminate the quality of a bonding portion according to heights printed by bonding tool on which ridges in different width are formed as disclosed in Japanese Patent Laid-Open Publication No. HEI 1-273328.

However, the bonding apparatus of the prior art would occasionally be encountered with connection defects, such as lowered connection strength of the bonding portion and a peeled surface, so that the functions of semiconductor devices and electronic elements can be impaired or the defective products can be caused. Because of this, the apparatus is not entirely reliable.

On the other hand, with the prior means for discriminating whether or not the bonded portion is good, it is easy to inspect the bonded portion but is difficult to discriminate whether or not the bonded portion is very reliable. Consequently, it was impossible to secure the reliability and quality in connecting the bonding portions of lead wires with pads and terminals of semiconductor devices and electronic elements, so the defective products increased with the peeled surface, the lead wires at the bonded portion breaking off while in use, the functions of the semiconductor devices, electronic elements, etc. were deteriorated with increased connection resistance.

Further, in the prior testing method and apparatus, after bonding, the bonded portion is visually inspected by an operator, because this test depend on the operator's skill, it is difficult to grasp the connection quality of the bonded portion, causing a poor operativity and hence taking a long time to conduct a test.

SUMMARY OF THE INVENTION

It is therefore an object of this invention to provide a bonding method and apparatus which are free from occurrence of connection defects such as peeled surface or lowered connection strength, and also to an apparatus for testing a bonded portion easily and very reliably.

According to a first aspect of the invention, there is provided a bonding apparatus which comprises a bonding tool, means for driving the bonding tool, means for detecting an amount of crushing of a bonding portion during bonding, means for calculating a rate of change of the amount of crushing detected by the amount-of-crushing detecting means, means for receiving and storing a target value, which is inputted from an external source, of the amount of crushing of the bonding portion, and means for controlling the driving means, the controlling means being capable of comparing the amount of crushing detected by the amount-of-crushing detecting means with the target value when the rate of change of the amount of crushing calculated by the calculating means is equal to or smaller than a predetermined value and also being capable of discriminating, when the amount of crushing detected by the crushing detecting means is smaller than the target value, that the bonding is being performed in a satisfactory manner and should be continued.

According to a second aspect of the invention, there is provided a tester for testing a bonding portion being bonded which comprises means for detecting the height of the bonded portion of the bonding portion and means for discriminating, when the height is within a predetermined range, that the bonding has been performed in a satisfactory manner and discriminating, when the height is out of the predetermined range, that the bonding has not been performed as required.

In the bonding apparatus of the invention, the amount of crushing of the bonding portion is detected by the amount-of-crushing detecting means to obtain a changing rate of the amount of crushing. This changing rate has a close relation with the quality (connection strength in particular) of the bonded portion; when the bonded portion is good, the changing rate of the amount of crushing is as shown in FIG. 3(a). In case the bonded portion is to be good, specifically, this changing rate becomes smaller at first, which means it does not change, and then gently varies and finally becomes smaller again. Therefore it is possible to discriminate whether or not the changing rate during bonding is such that the bonding is performed so as to realize a product of the required quality.

When the changing rate of the amount of crushing is initially low, the controlling means discriminates, from the current amount of crushing, whether or not the bonding is good enough to result in a product of the required quality. If the amount of crushing at that time is equal to a predetermined target value, the bonding will be continued to cause good quality products. If it is smaller than the target value, the ultrasonic output will be increased to crush the bonding portion more so that the amount of crushing will finally reach the target value. If it is larger than the predetermined target value, the bonding will be stopped, for it would have been difficult to achieve product of the required quality even though controlled.

Thus since the bonding will be stopped immediately if a defective bonding portion is detected, it is possible to minimize the number of defective products so that the number of tests to be conducted can be reduced.

With the testing apparatus of this invention, it is possible to conduct a test easily with high reliability by measuring the height of the bonding portion after bonding, based on a close relationship between the height of the bonding portion and the connection strength as shown in FIG. 5. Assuming that the bonding is conducted under the same conditions, the height of the bonding portion of a good quality product is within a proper range. Therefore, by setting a predetermined proper range in the discriminating means and checking whether or not the height of the sample is within this range, it is possible to conduct a test with ease.

DETAILED DESCRIPTION OF THE PREFERRED EMBODIMENTS

First Embodiment

Figure 11:
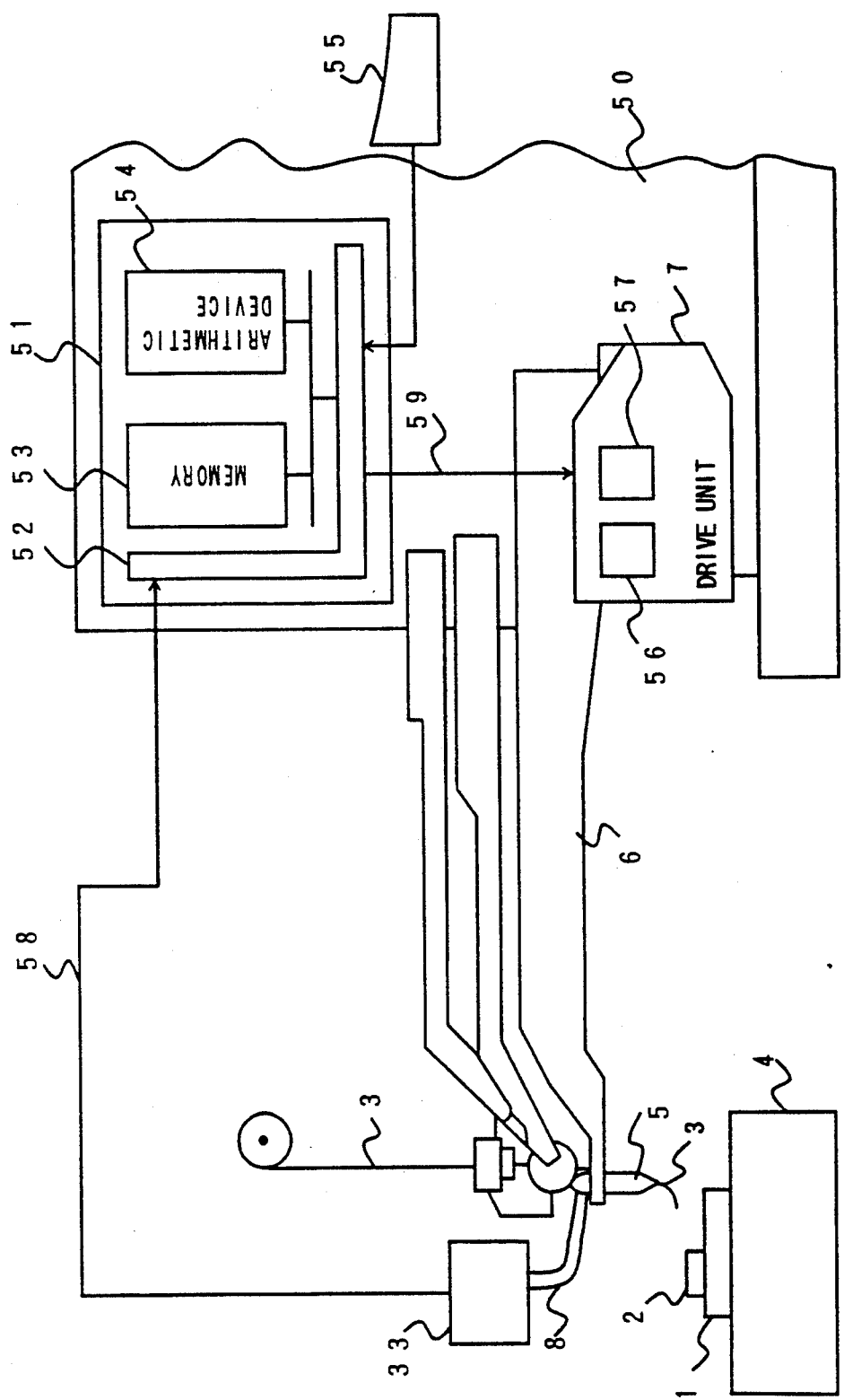
FIG. 11 shows a bonding apparatus according to a first embodiment of this invention.

A bonding apparatus according to a first embodiment of this invention will now be described with reference to the accompanying drawings. As shown in FIG. 11, the bonding apparatus comprises a bonding tool 5, a drive unit 7 for driving the bonding tool 5, a horn 6 connecting the bonding tool 5 with the drive unit 7, and a support 50 for supporting the bonding tool 5 and the drive unit 7. On the support 50, a processor 51 for controlling the drive unit 7 is also mounted. The processor 51 includes an interface 52, a memory 53, an arithmetic device 54, and an input device 55.

Figure 8:
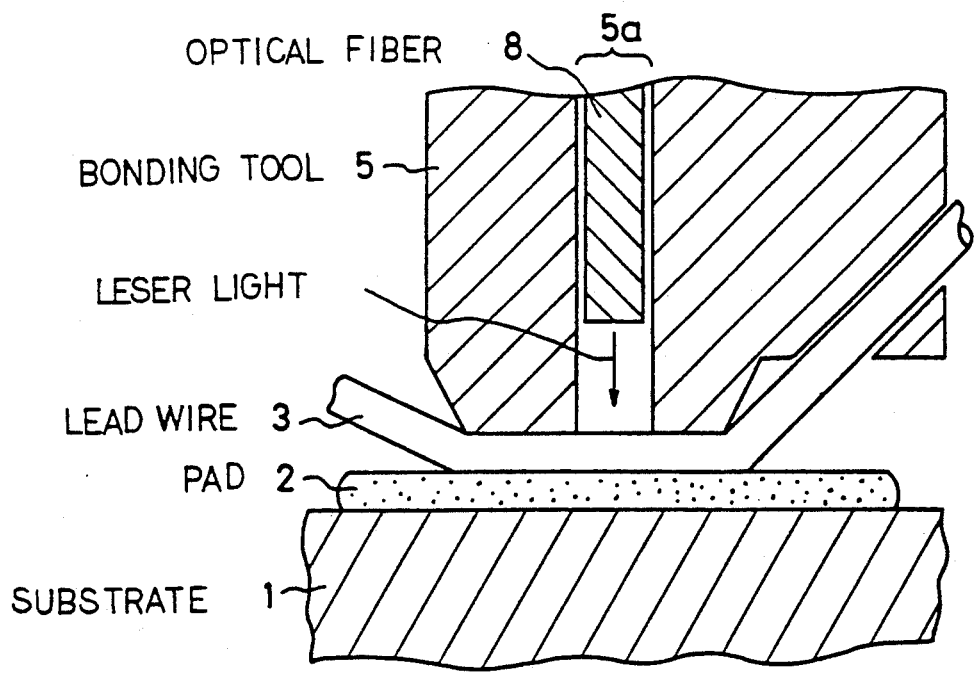
FIG. 8 is a cross-sectional view showing a distal end portion of a bonding tool of the first embodiment.

The bonding tool 5, as shown in FIG. 8, has a through-hole 5a at the center of the bonding tool 5, through which an optical fiber 8 extends. The optical fiber 8 is connected to an optical position detecting sensor 33. The position detecting sensor 33 radiates laser light to the surface of a lead wire 3 and receives reflected light via the optical fiber 8 to detect the height of the surface of the lead wire 3 from a focus position. The optical fiber 8 is not fixed to the bonding tool 5 so that it does not move with the lowering of the bonding tool 5.

The processor 51 is connected to the position detecting sensor 33 via a signal line 58 and also to the drive unit 7 via a control line 59. The drive unit 7 has a pressure device 56 for pressurizing the bonding tool 5 and an ultrasonic generator 57 for ultrasonically vibrating the bonding tool 5.

Figure 1:
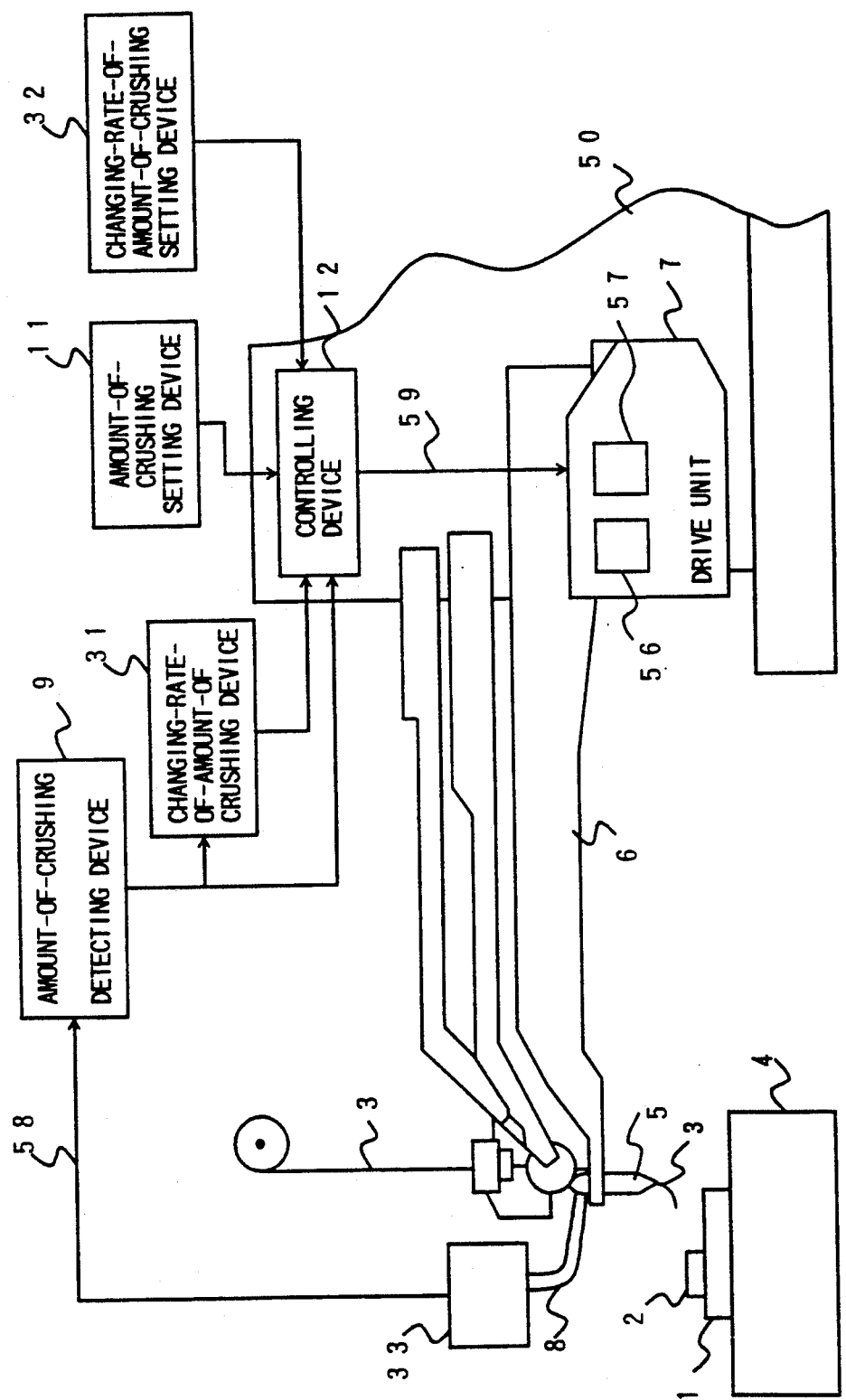
FIG. 1 shows a bonding apparatus according to a first embodiment of this invention.

The functional construction of the bonding apparatus of this embodiment will now be described with reference to FIG. 1. As the arithmetic device 54 performs a program stored in the memory 53, the processor 51 of FIG. 11 functions as a detecting device 9 for detecting the amount of crushing, a calculating device 31 for calculating the rate of change of the amount of crushing, an amount-of-crushing setting device 11, a changing-rate-of-amount-of-crushing setting device 32, and a controlling device 12, which are shown in FIG. 1.

The amount-of-crushing detecting device 9 receives, from the position detecting sensor 33 via the signal line 58, both the height of the surface of the lead wire 3 at the start of bonding and the height during bonding and then obtains the difference in order to detect the amount of crushing of the lead wire 3. To determine the time to discriminate whether or not the bonding is such as to result in a product of required quality, the changing-rate-of-amount-of-crushing setting device 32 receives an arbitrary value for the changing rate of the amount of crushing, which is inputted to the input device 55 from the user, and stores this value in the memory 53. The amount-of-crushing setting device 11 receives target values for the amount of crushing of the lead wire 3 at the time of discrimination and the amount at the end of bonding, which values are inputted to the input device 55 from the user, and stored in the memory 53. The changing-rate-of-amount-of-crushing calculating device 31 receives the amount of crushing from the amount-of-crushing detecting device 9 and then differentiates the received amount of crushing with respect to time to calculate a rate of change of the amount of crushing.

When the rate of change of the amount of crushing calculated by the changing-rate-of-amount-of-crushing calculating device 31 is equal or smaller than the value set in the changing-rate-of-amount-of-crushing setting device 32, the controlling device 12 judges that it is a time point for discrimination. At the time point of discrimination, the controlling device 12 compares the amount of crushing detected by the amount-of-crushing detecting device with the target value set in the amount-of-crushing setting device 11. If it is equal to or smaller than the target value, the controlling device 12 discriminates that the bonding is such as to result in a product of required quality and should be continued. If it is larger than the target value, the controlling device 12 discriminates that the bonding is such as to cause an inferior product and should be stopped.

Prior to the bonding using the bonding apparatus of this embodiment, the amount of crushing of an ordinary lead wire is measured by the position detecting sensor 33 and the amount-of-crushing detecting device 9. If the bonded portion is a required state, the change of the amount of crushing is such as is shown in FIG. 3(a). Namely, the lead wire 3 deforms drastically at the beginning of bonding, then during period 34a of the bonding process, deformation almost terminates, and with continued bonding, the lead wire deforms gradually until period 34b of the bonding process, when deformation terminates. With a view to this characteristic change of the amount of crushing of a lead wire, the controlling device 12 controls the bonding so as to result in product of a required quality.

Figure 3:
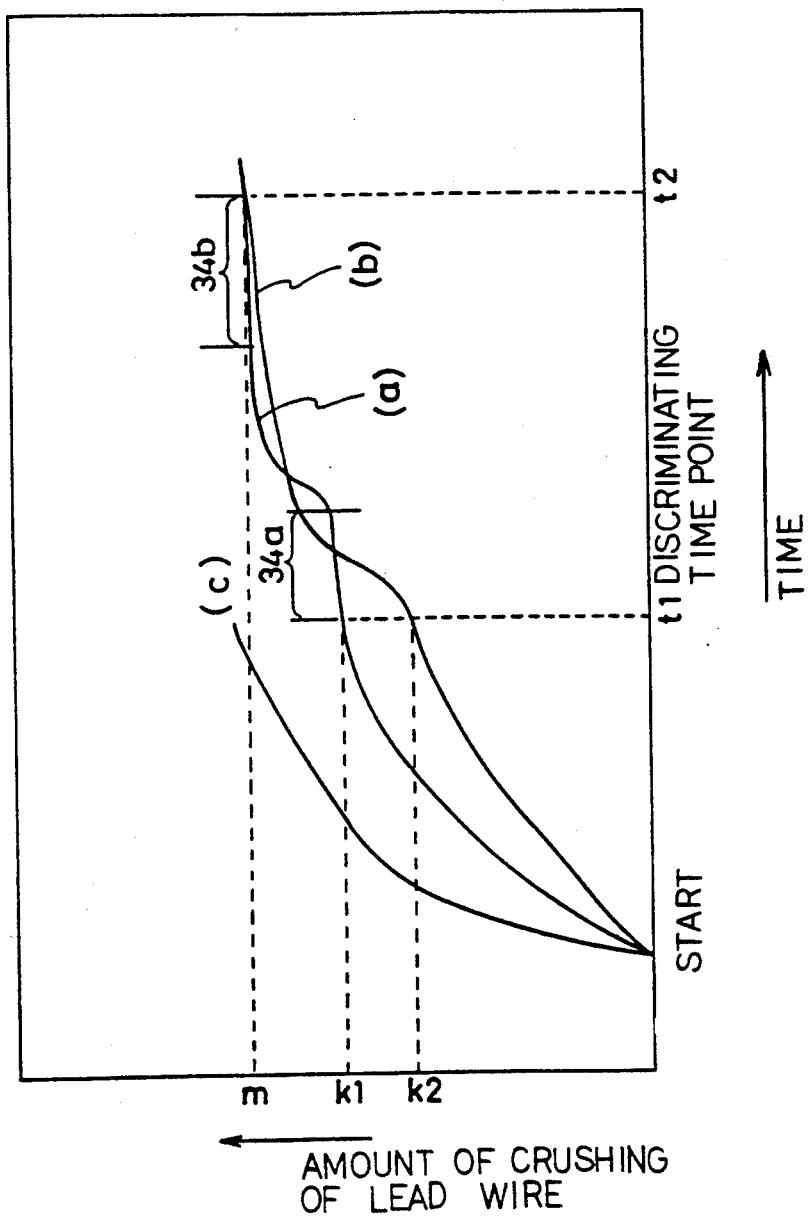
FIG. 3 is a graph showing variation of amount of crushing of a lead wire with respect to time during bonding.
Figure 9:
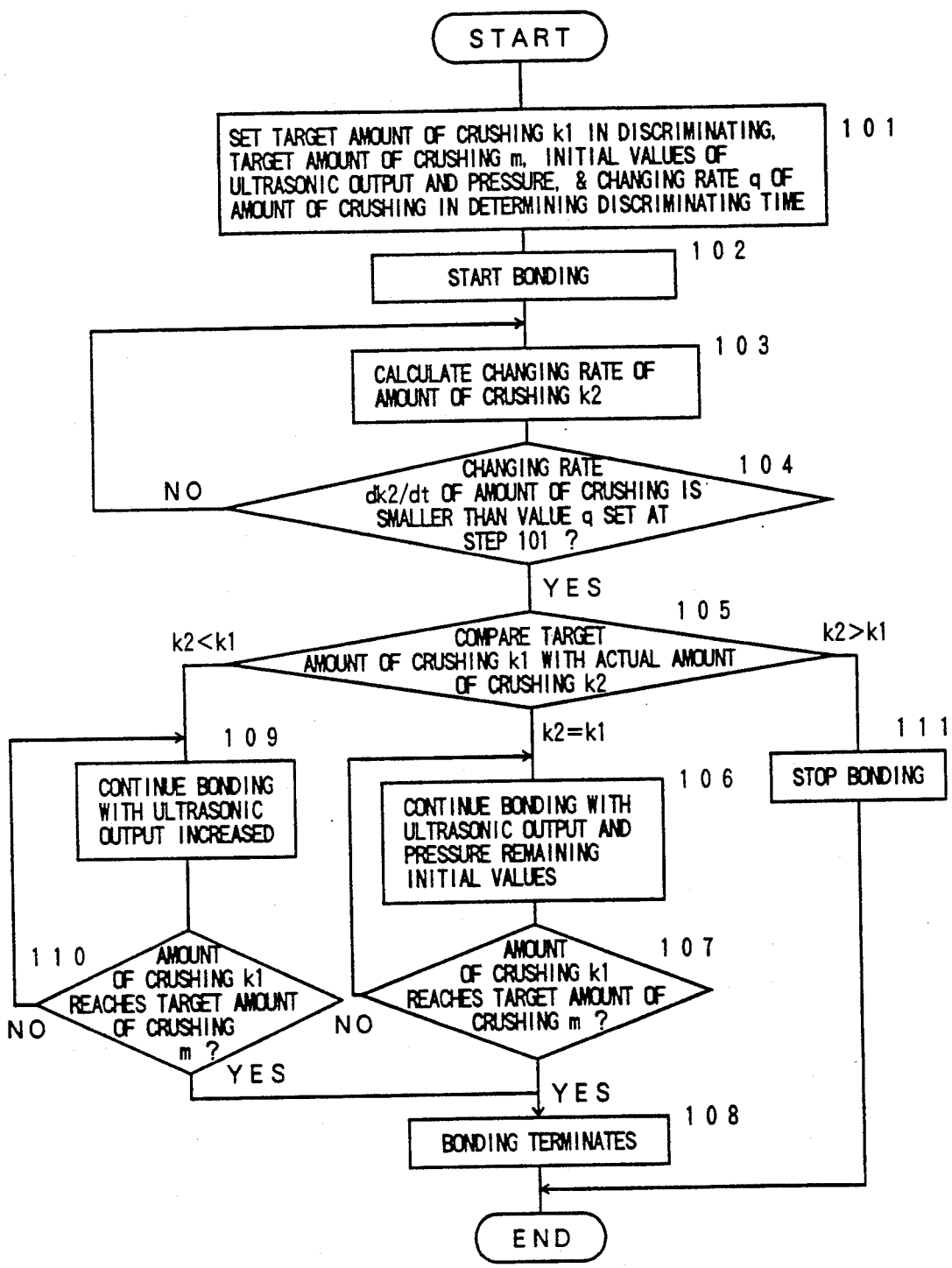
FIG. 9 is a flow diagram showing a bonding method used in the bonding apparatus of the first embodiment.

The mode of bonding using the bonding apparatus of this embodiment will now be described with reference to FIG. 9. Firstly the user sets a target amount of crushing m in the amount-of-crushing setting device 11 from the input device 55, based on the graph of FIG. 3 showing the change of the amount of crushing of a lead wire during bonding when a required quality product was obtained by the above-mentioned previous experiment. The target amount of crushing m is preferably within a range of 50% to 60% of the diameter of a lead wire 3. Then the user sets a changing rate q of the amount of crushing, which is for determining the time to discriminate whether or not the bonding is such as to result in a product of required quality, in the changing-rate-of-amount-of-crushing setting device 32 from the input device 55. In FIG. 3, the changing rate q of the amount of crushing represents a value including the rate of change of period 34a of the bonding process where the deformation is almost stopped. Further, the target amount of crushing m to be used in discriminating is set in the amount-of-crushing setting device 11 from the input device 55. The target amount of crushing m defines the amount of crushing during part of the bonding period 34a of FIG. 3 where the deformation is almost stopped. In the controlling device 12 the ultrasonic output and the pressure are set as initial values when driving the bonding tool 5. (Step 101).

The controlling device 12 instructs the ultrasonic output and the pressure, which are set at step 101, to the drive unit 7. In response to the instructions, the drive unit 7 activates the ultrasonic generator 57 and the pressure device 56, thus causing the bonding tool 5 to start bonding the lead wire 3 (Step 102). The detecting device 9 detects an actual amount of crushing k2 of the lead wire 3. The changing-rate-of-amount-of-crushing calculating device 31 differentiates the detected amount of crushing k2 to calculate a rate of change (Step 103). The controlling device 12 compares the actual changing rate dk2/dt of the amount of crushing, which is outputted by the changing-rate-of-amount-of-crushing calculating device 31, with the changing rate q of the amount of crushing, which is set at step 101, and if the actual changing rate dk2/dt is smaller than the preset changing rate q, the controlling device 12 discriminates that it is a time to discriminate. (Step 104). Then the routine goes to step 105. At step 105, the target amount of crushing k1 of the amount-of-crushing setting device 11 is compared with the current actual amount of crushing k2 to discriminate whether or not the bonding is such as to result in a product of required quality.

If the actual amount of crushing k2 is equal to the target amount of crushing k1 at step 105, the controlling device 12 discriminates that the bonding is such as to result in a product of required quality, and then controls the drive unit 7 to continue bonding maintaining the ultrasonic output and the pressure value of the drive unit 7 (Step 106). When the actual amount of crushing k2 reaches the target amount of crushing m (step 107), the bonding terminates (step 108). This changing rate of the amount of crushing is such shown in FIG. 3 at point (a).

If the actual amount of crushing k2 is smaller than the target amount of crushing k1 at step 105, the controlling device 12 discriminates that the bonding is still such as to cause a good quality product, and then increases the ultrasonic power of the drive unit 7 to increase the amount of crushing and controls the drive unit 7 so as to continue bonding (step 109). The routine goes to step 108, when the amount of crushing k1 reaches the target amount of crushing m (step 110) where the bonding terminates. This changing rate of crushing is such as is shown in FIG. 3 at point (b).

If the actual amount of crushing k2 is larger than the target amount of crushing k1 at step 105, the controlling device 12 discriminates that the bonding is such as to result in a product inferior, and then controls the drive unit 7 to stop bonding (Step 111). Also if the actual amount of crushing k2 exceeds the target amount of crushing k1 before the changing rate of the amount of crushing dk2/dt reaches the value q set in the changing-rate-of-amount-of-crushing setting device 32, the controlling device 12 discriminates that the bonding is such as to cause an inferior product, and then controls the drive unit 7 to stop bonding FIG. 3 at point (c).

With the bonding apparatus of this embodiment, when the actual changing rate of the amount of crushing is smaller than a predetermined value, a discrimination is made, during bonding, whether the bonding is such as to cause a good product or an inferior product. Generally, if the actual amount of crushing k2 is smaller than the target amount of crushing k1 at step 105 as shown in FIG. 3 at point (b), continued bonding would cause an inferior product due to the inadequate amount of crushing. Whereas in this embodiment, since the ultrasonic output can be increased by making a discrimination during bonding, it is possible to still result in a product of required quality, thus improving the yield. In the case of a lead wire, as shown in FIG. 3 at point (c), in which the changing rate of the amount of crushing is too high, namely, the bonding area is too small to cause an efficient connection, it is difficult to perform the bonding such that a good quality product can be achieved. Consequently the bonding should be stopped so as not to cause an inferior product, thus increasing the rate of production. Since the driving time of the bonding tool is thereby reduced, the friction between the lead wire and the bonding tool will be minimized to improve the durability of the bonding tool. In the bonding apparatus of this embodiment, since the bonding terminates when the actual amount of crushing reaches the target amount of crushing m, it is free from any peel at the bonding portion as it take too long a time, thus not lowering the connection strength.

The target amount of crushing k1 at the time of discrimination which is to be set at step 101 may be within a certain range. For this purpose, experiments are previously conducted on a plurality of samples, and such a value is obtained from that fluctuation of the amount of crushing which caused products of the required quality. Usually the fluctuation ranges from −5% to +5%.

In this embodiment, the individual lead wire is directly measured using the optical position detecting sensor 33 as the amount-of-crushing detecting device 9. However, this invention should be no means be limited to this specific method; for example, the amount of crushing may be detected by detecting the position of the upper end of the bonding tool 5.

Second Embodiment

Figure 6:
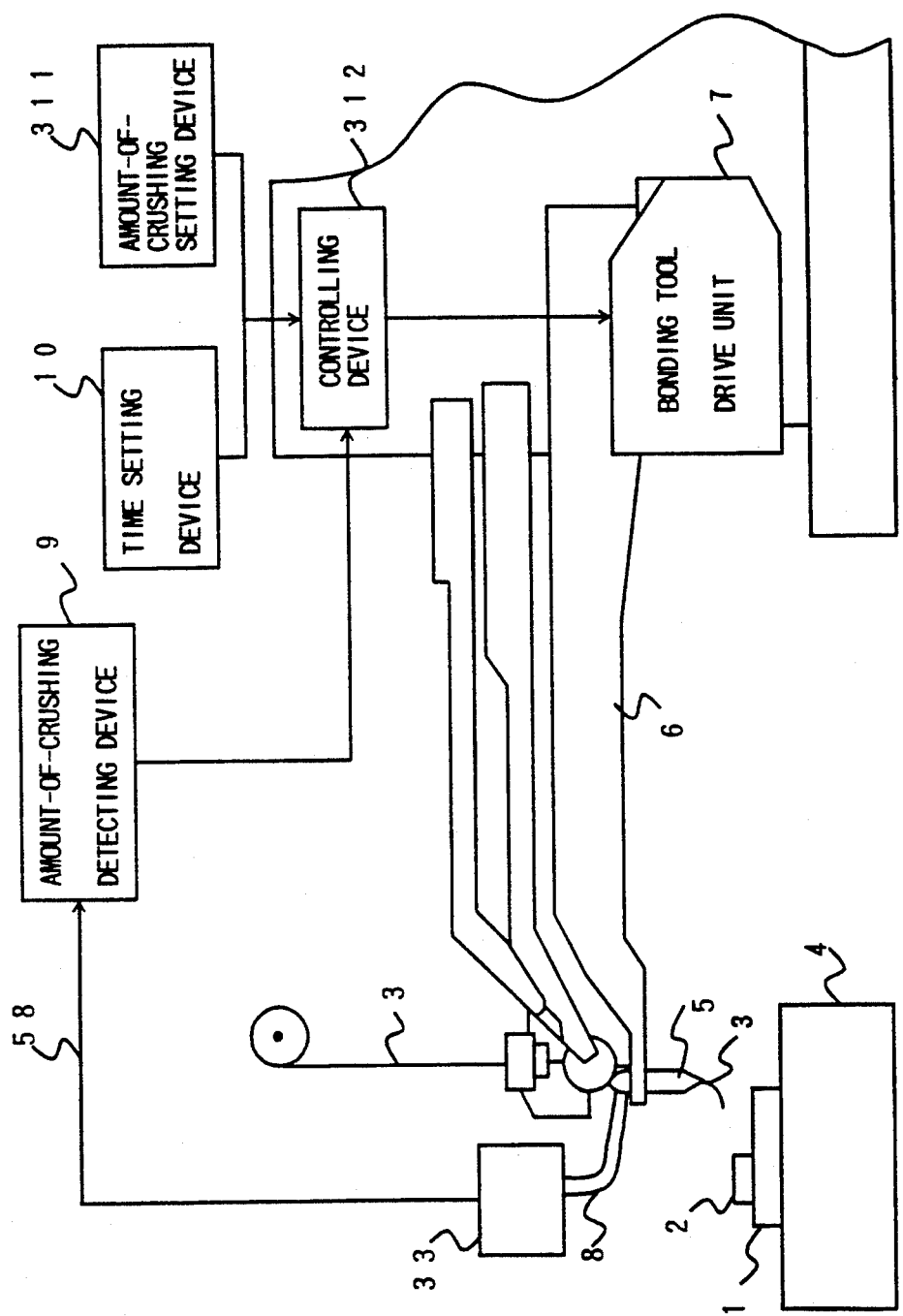
FIG. 6 shows a modified bonding apparatus according to a second embodiment.

A bonding apparatus according to a second embodiment of this invention will now be described with reference to the drawings. As shown in FIG. 6, the bonding apparatus comprises a bonding tool 5, a drive unit 7 for driving the bonding tool 5, a horn 6 connecting the bonding tool 5 with the drive unit 7, and a support 50 for supporting the bonding tool 5 and the drive unit 7. On the support 50, a processor 51 for controlling the drive unit 7 is also mounted. The processor 51 includes an interface 52, a memory 53, an arithmetic device 54, and an input device 55.

The bonding tool 5, as shown in FIG. 8, has a through-hole 5a at the center of itself, through which an optical fiber 8 extends. The optical fiber 8 is connected to an optical position detecting sensor 33. These parts are identical with those of the first embodiment and so their detailed description is omitted.

The processor 51 is connected to the position detecting sensor 33 via a signal line 58 and also to the drive unit 7 via a control line 59. Inside the drive unit 7, there are mounted a pressure device 56 for pressurizing the bonding tool 5 and an ultrasonic generator 57 for ultrasonically vibrating the bonding tool 5.

The functional construction of the bonding apparatus of this embodiment will now be described with reference to FIG. 6. As the arithmetic device 54 performs a program stored in the memory 53, the processor 51 of FIG. 11 functions as a detecting device 9 for detecting the amount of crushing, a time setting device 10, an amount-of-crushing setting device 311, and a controlling device 312, which are shown in FIG. 6.

The amount-of-crushing detecting device 9 receives, from the position detecting sensor 33 via the signal line 58, both the height of the surface of the lead wire 3 at the start of bonding and that during bonding and then obtains the difference so as to detect the amount of crushing of the lead wire 3. The amount-of-crushing setting device 311 receives target values, for the amount of crushing of the lead wire 3 at the end of bonding, which are inputted to the input device 55 from the user, and stores these values in the memory 53. The time setting device 10 receives a target bonding time, which is from the start of bonding to a predetermined time set in the amount-of-crushing setting device 311, and stores this target time in the memory 53.

The controlling device 312 stores in the memory 53 both a first relation, which is inputted to the input device by the user for determining a discriminating time to discriminate whether or not the bonding is to be continued, and a second relation, which is inputted to the input device 55 from the user for determining an amount of crushing to be used in this discrimination. According to the present first relation, the controlling device 312 discriminates a certain time, which is within the time set in the time setting device 10, as the discriminating time. And according to the present second invention, controlling device 312 discriminated the amount of crushing which is smaller than the amount of crushing set in the amount-of crushing-setting device 311 as the amount of crushing be used in discriminating. When it reaches the discriminating time after bonding has started, the amount of crushing detected by the detecting device 9 is compared with the amount of crushing to be used in discriminating, and if it is smaller than the target amount of crushing to be used in discriminating, the controlling device 312 discriminates that the bonding is such as to result in a product of required quality and instructs the drive unit 7 to continue bonding. If it is larger than the target amount of crushing to be used in discriminating, the controlling device 312 discriminates that the bonding is such as to cause an inferior product and instructs the drive unit 7 to stop bonding.

Similarly to the first embodiment, prior to the bonding using the bonding apparatus of this embodiment, the amount of crushing of an ordinary lead wire is measured by the position detecting sensor 33 and the amount-of-crushing detecting device 9. If the bonded portion is a required state, the change of the amount of crushing is such as is shown in FIG. 3 at point (a). Namely, the lead wire 3 deforms drastically at the beginning of bonding, then during period 34a of the bonding process, almost terminates deforming, and thence with continued bonding, the lead wire deforms gradually until, at period 34b of the bonding portion, it terminates deforming. With a view to this characteristic change of the amount of crushing of a lead wire, the controlling device 12 controls the bonding so as to cause a good quality product. The time for the controlling device 312 to discriminate whether or not the bonding is to be continued is preferably a time t1 for the period 34a of the bonding process to almost terminate deforming. Generally, according to many experiments conducted under the direction of the present inventor(s), the time t1 is on many occasions within a range of 30% to 50% of the time t2 when the bonding terminates. The amount of crushing k1 at the time t1 is on many occasions within a range of 80% to 90% of the target amount of crushing m at the end of bonding.

Figure 10:
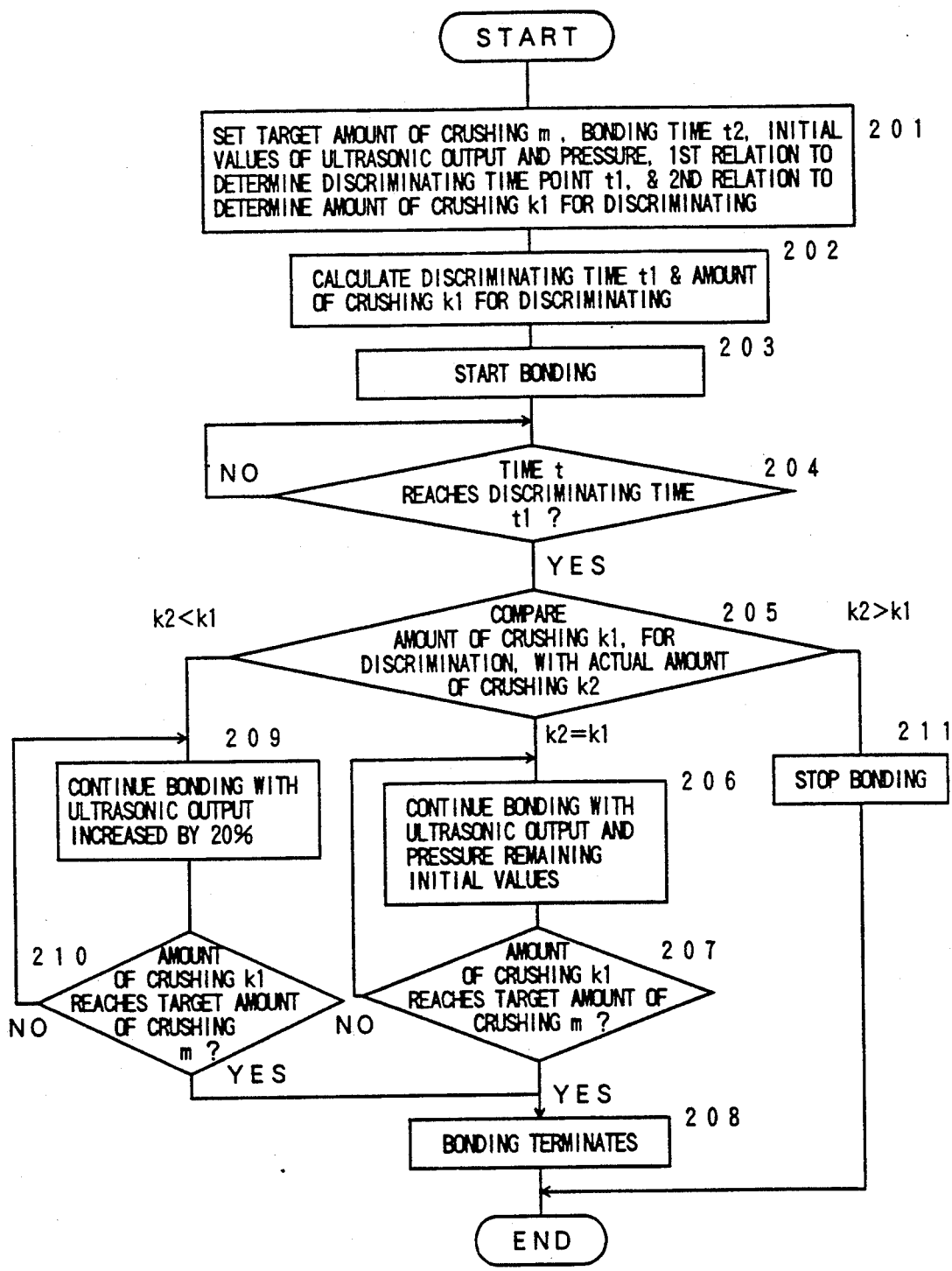
FIG. 10 is a flow diagram showing a bonding method used in the bonding apparatus according to the second embodiment.

The mode of bonding using the bonding apparatus of this embodiment will now be described with reference to FIG. 10. In this embodiment, a copper lead wire 3 (50 μm in diameter) plated with gold (3 μm in thickness) is wedge-bonded to a pad 2 (plated with gold, 50 μm in thickness) of an IC circuit package 1. Firstly, the user sets the target amount of crushing m (28 μm) in the amount-of-crushing setting device 311 from the input device 55, based on the graph of FIG. 3 showing the change of the amount of crushing of the lead wire during the bonding of the required quality product obtained by the experiments. The target amount of crushing m is preferably within a range of 50% to 60% of the diameter of the lead wire 3. The user then sets the time t2 (0.8 sec), which is from when bonding is started to when it reaches the target amount of crushing m, in the time setting device 10 from the input device 55, based on the experiments. An ultrasonic frequency of 40 kHz and a pressure of 100 gf, as initial values when driving the bonding tool 5, are set in the controlling device 312 from the input device 55. Further, based on the graph of FIG. 3 showing the change in the amount of crushing of the lead wire during the bonding of a required quality product obtained by the experiments, the controlling device 312 sets (discriminating time t1)=(time t2 set in the time setting device 10)×0.4 as the first relation for determining the time to discriminate whether or not the bonding is to be continued. Or the controlling device 312 sets
(amount of crushing k1 to be used in discriminating)=(amount of crushing set in the amount-of-crushing setting device 311)×0.85 as the second relation for determining the amount of crushing to be used in discriminating. (Step 201).

The controlling device 312 calculates the discriminating time t1 from the first relation set at step 201, and also the amount of crushing k2, which is to be used in discriminating, from the second relation (Step 202). The controlling device 312 also instructs the ultrasonic output and the pressure value, which are set at step 201, to the drive unit 7. In response to this, the drive unit 7 actuates the bonding tool 5 to start bonding (Step 203). The detecting device 9 detects the amount of crushing k2. The controlling device 312 monitors whether or not the time t from the start of bonding reaches the discriminating time t1, and if it reaches the discriminating time t1, the routine goes to step 105. (Step 204). At step 204, the controlling device 312 compares the amount of crushing k1, which is to be used in discriminating and is obtained at step 202, with the actual amount of crushing detected by the detecting device 9 (step 205).

If at step 205 the actual amount of crushing k2 is equal to the amount of crushing k1 to be used in discriminating, the controlling device 312 discriminates that the bonding is such as to result in a product of required quality, and instructs the drive unit 7 to continue bonding, maintaining the ultrasonic output and the pressure value (Step 206). When the amount of crushing k1 reaches the target amount of crushing m (step 207), the bonding terminates (step 208). This change of the amount of crushing is such as is shown in FIG. 3 at point (a).

If at step 205 the actual amount of crushing k2 is smaller than the amount of crushing k1 to be used in discriminating, the controlling device 312 discriminates that the bonding is such as to be good in a product of required quality, and then increases the ultrasonic power of the drive unit 7 to increase the amount of crushing and controls the drive unit 7 so as to continue bonding (step 209). The routine goes to step 208, when the amount of crushing k1 reaches the target amount pf crushing m (step 210), then the bonding terminates. This change of the amount of crushing is such as is shown in FIG. 3 at point (b).

If at step 205 the actual amount of crushing k2 is larger than the amount of crushing k1 to be used in discriminating, the controlling device 312 discriminates that the bonding is such as to cause an inferior product, and instructs the drive unit 7 to stop bonding (step 211). Also if the amount of crushing k2 exceeds the amount of crushing k1 before the time t reaches the discriminating time t1, the controlling device 312 discriminates that the bonding is such as to cause an inferior product, and instructs the drive unit 7 to stop bonding. This change of the amount of crushing is such as is shown in FIG. 3 at point (c).

As a comparative example, bonding was performed for a bonding time of 0.8 sec. while maintaining the ultrasonic frequency of 60 kHz and the pressure of 100 gf as conventional. The connection strengths of the joint bonded by the bonding apparatus of this embodiment and that of the joint bonded by the conventional method of the comparative example are shown in Table 1.

TABLE 1

|  | CONNECTION STRENGTH (gf) | DAMAGE |
| --- | --- | --- |
| CONVENTIONAL METHOD | 24~36 | ALL LEAD WIRES BROKEN |
| PRESENT METHOD | 37~43 | PART OF SURFACE PEELED |

Figure 7:
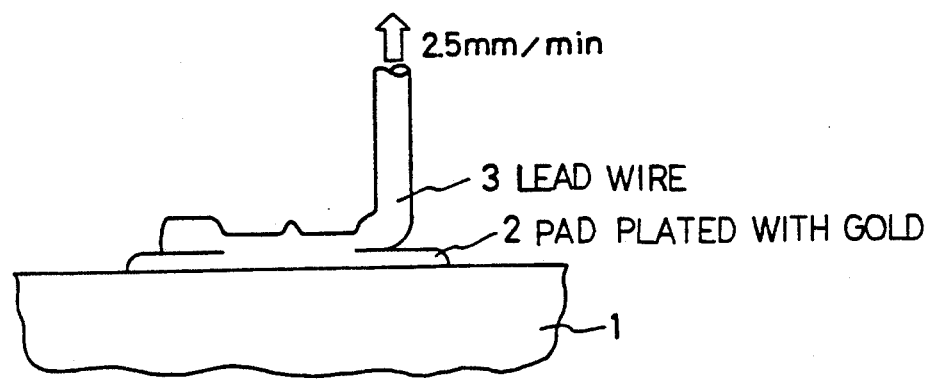
FIG. 7 shows a connection-strength measuring method.

The individual connection strength shown in Table 1 was defined by measuring a breaking load as the bonded lead wire was pulled at a speed of 2.5 mm/min perpendicularly with respect to the pad 2 and the bonding portion, as shown in FIG. 7.

Table 1 shows that in the conventional method the connection strength was in the range of 24 to 36 gf, which was weak enough to allow the lead wire to be broken, whereas in the method of this embodiment the connection strength was in the range of 37 to 43 gf, which was strong enough and more consistent, allowing only part of the bonding portion to be peeled at the surface.

In this embodiment, the target amount of crushing k1 to be calculated at step 202 may be within a certain range. For this purpose, experiments are previously conducted on a plurality of samples, and such a target value is obtained from a fluctuation of the amount of crushing k1 which caused good quality products. Based on this value, it is preferable to obtain the second relation. Usually the fluctuation ranges from −5% to +5%.

Since a discrimination is made by measuring the amount of crushing of the lead wire 3 during bonding, the bonding apparatus of this embodiment is free from defective connection, such as fluctuation and lowering of the connection strength of the bonding portion as well as peeling of the surface, so that a stable quality connection can be achieved. The IC circuit package bonded by the bonding apparatus of this embodiment can be prevented from becoming non functional while in use due to an increase in the connection resistance of the bonding portion and also from the breaking of any lead wires, thus increasing the reliability. Even though pads 2 and lead wires 3 are made of different materials, the bonding apparatus of this embodiment is free from the lowering of function due to increase in the connection resistance of the bonding portion and also from the breaking of any lead wires, thus causing a stable connection quality.

At step 206 in this embodiment, the controlling device 312 may enable continuation of bonding with the ultrasonic output lowered. With lowered ultrasonic output, it is possible to effectively increase the connection area of the bonding portion, thus increasing the connection strength and improving the reliability. Since the amplitude during bonding is small, there is less friction between the lead wire and the bonding tool so that the durability of the bonding tool can be improved.

Further, at step 206 of this embodiment, the controlling device 312 may enable continuation of bonding with the ultrasonic frequency increased. In this case, after a bonding portion is formed by deforming the lead wire by a preset target amount of crushing at constant ultrasonic frequency, output and pressure, the initial ultrasonic frequency is increased to reduce the amplitude so that the bonding area of the bonding portion can be increased efficiently, thus increasing the connection strength and improving the reliability. Since the amplitude during bonding is small, there is less friction between the lead wire and the bonding tool so that the durability of the bonding tool can be improved.

Third Embodiment

Figure 2:
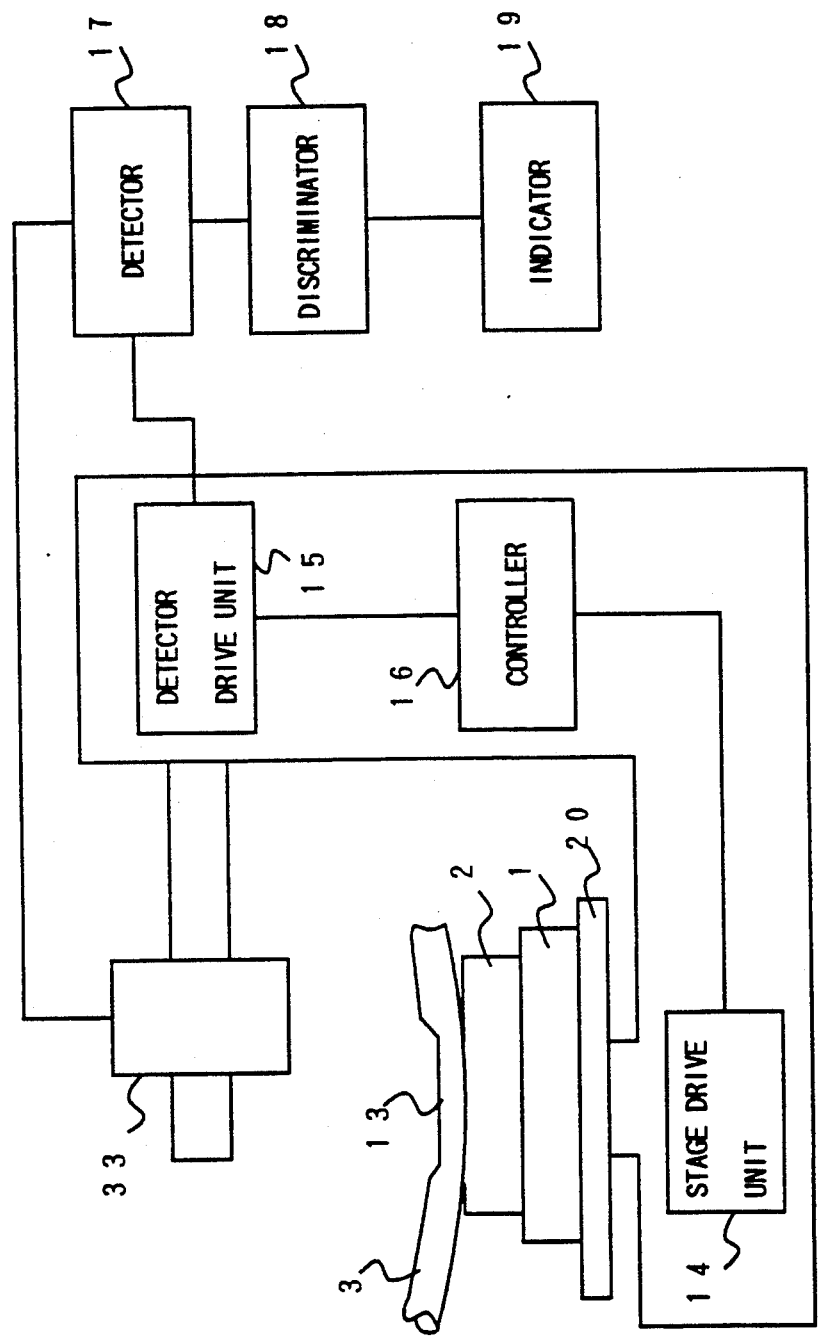
FIG. 2 shows a bonding-portion testing apparatus according to a third embodiment.

A bonding-portion testing apparatus according to a third embodiment of this invention will now be described with reference to FIG. 2. As shown in FIG. 2, the testing apparatus includes a position detecting sensor 33, for detecting the height on a bonding portion 13 of a lead wire 3 which is mounted on a stage 20. The testing apparatus also includes a detector 17 for calculating the height of the bonding portion 13 of the lead wire 3 from the result of detection of the position detecting sensor 33, a discriminator 18 for discriminating whether or not the height of the bonding portion 13 is within an allowable range, and an indicator 19 for indicating whether or not the bonding is such as to result in a product of required quality. This allowable range may be preset in the discriminator 18. A drive unit 15 for driving the detector 17 and a stage drive unit 14 for driving the stage 20 are controlled by a controller 16.

The testing apparatus measures the height of the bonding portion 13 of the bonded lead wire 3 at at least one point and discriminates whether or not the height of the bonding portion 13 of the lead wire 3 is within an allowable range of a standard bonding portion. The bonding portion of the lead wire 3 bonded in a certain constant condition has a close relation with the quality (connection strength in particular) and height of the bonding portion.

Figure 4:
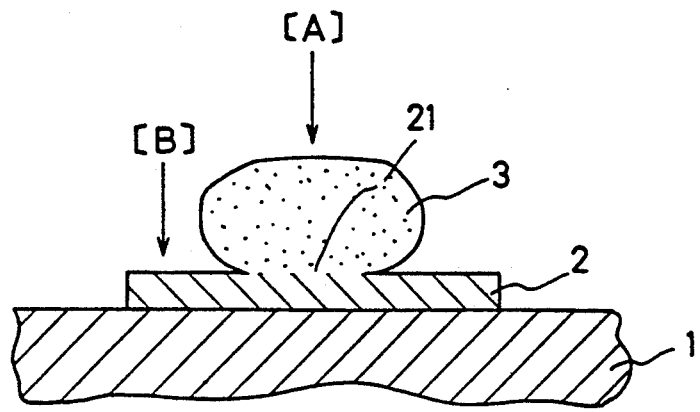
FIG. 4 shows a measuring position of the testing apparatus of the third embodiment.
Figure 5:
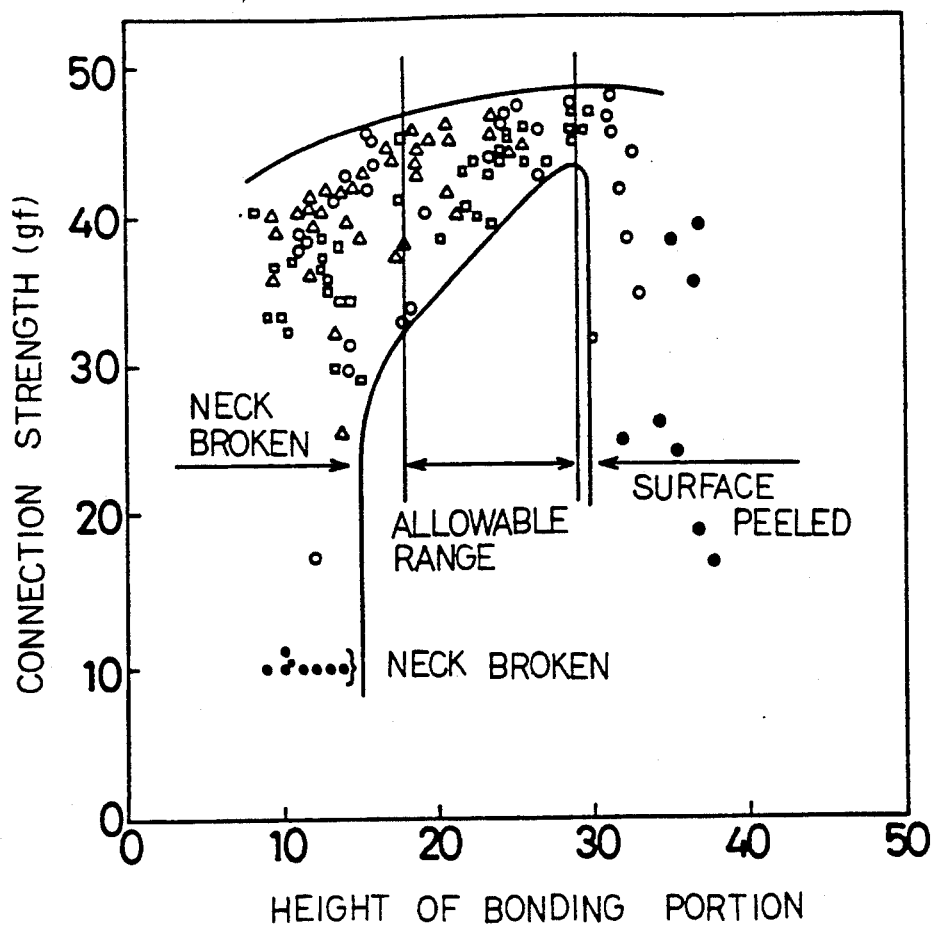
FIG. 5 is a graph showing the relationship between the height and the connection strength of a bonding portion.

FIG. 5 shows a relationship between the height and the connection strength of a bonding portion. The height of the bonding portion was measured using the testing apparatus of FIG. 2. As shown in FIG. 7, the connection strength is a breaking strength as measured when the lead wire 3 was pulled perpendicularly with respect to a pad surface 2. In measuring the height of the bonding portion, as shown in FIG. 4, the position detecting sensor 33 radiated infrared laser light over the bonding portion of the lead wire 3 (at A in FIG. 4) and the reference surface of the pad surface 2 (at B in FIG. 4) and measured respective focus positions from the reflected light from the bonding portion of the lead wire 3 and the pad surface 2, thereupon a difference between the focus positions of the bonding portion and the pad surface was calculated.

As shown in FIG. 5, if the height of the wedge-bonded portion of the lead wire 3 is large, the joint tends to be peeled at the surface, thus varying the connection strength over a wide range. If the height of the bonding portion is small, the connection strength is generally lower and varies over a wide range. It turned out from FIG. 5 that the joint was free from peeling at the surface and high and consist in connection strength when the height of the bonding portion was within a proper range (19 to 29 $\mu$m in this case).

The testing apparatus of this embodiment, includes a discriminator 18 for discriminating the height of the bonding portion detected by the detector 17 and indicator 19 for displaying the result of the discrimination. The allowable range may preset in the discriminator 18.

Using the testing apparatus of this embodiment, it was discriminated whether or not the bonding portion wedge-bonded in a constant bonding condition was good. A copper lead wire plated with gold (3 $\mu$m in thickness) was wedge-bonded to a pad (plated with gold, 5 $\mu$m) of an IC package under following the wedge-bonding conditions: an ultrasonic frequency of 40 kHz; a power of 1 W; a pressure of 150 gf; and a joining time of 0.5 sec. One thousand samples were used in the test. The allowable range was set in the range of 19 to 29 $\mu$m.

Connection strength measurements were made on these samples by the above-mentioned method of FIG. 7. There results are shown in Table 2.

TABLE 2

| DISCRIMINATION | NUMBER OF PRODUCT | CONNECTION STRENGTH (gf) |
|---|---|---|
| QUALIFIED PRODUCT | 933/1000 | 36~42 (LEAD WIRE BROKEN) |
| DEFECTIVE PRODUCT (HIGH BONDING PORTION | 1/1000 | 26 (SURFACE PEELED) |
| DEFECTIVE PRODUCT (LOW BONDING PORTION) | 6/1000 | 19~24 (LEAD WIRE BROKEN) |

As seen from Table 2, the number of up to quality products was 993, and the connection strength was in the range of 36 to 42 gf (measured at ten points). The only inferior product with which it was discriminated that the height of the bonding portion was larger than the target value, had a connection strength of 26 gf, being peeled at the surface. The six remaining inferior products, which were discriminated as having the height of the bonding portion smaller than the target value, had a connection strength of 19 gf. The test results show that the measured connection strength was equal to the target value and that it was effective in discriminating in reduced time whether or not the bonded portion is good.

With this testing apparatus, partly since unconnected products due to for instance, peeling at the surface and badly connected products having low connection strength, due to for example the overcrushing of the lead wire can be minimized, and partly since fluctuation of the connection strength can be reduced, it is possible to provide consistently high-quality electronic elements and semiconductor devices. Further, by using this testing apparatus, it is possible to prevent products suffering from lowered in functionality due to any connection resistance increase of the bonding portion and from becoming unusable due to any breakage, thus improving the reliability of semiconductor devices and electronic elements. Furthermore, this testing apparatus can measure and record the height of the bonding portion accurately in a short time so that it is possible to realize quality control of products with ease.

In the testing method and apparatus of this invention, the detector and means for measuring the height of the bonding portion should by no means be limited to any specific form. For example, the height of the bonding portion may be measured by radiating visible light or infrared laser light over the bonding portion, the terminal and the pad surface and then measuring the respective focus positions of the bonding portion, the terminal and the pad surface using the reflected light therefrom. Alternatively, the height of the bonding portion may be measured from the difference between respective electrostatic capacitances of the bonding portion and the pad surface. In each of these methods, a measurement can be done in a short time in a non-contact manner without any damage to the products so that it is possible to test the bonding portion accurately.

Thus the bonding apparatus and the testing apparatus of this invention are suitable for connecting lead wires with terminals of electronic elements of every kind. They are particularly useful for semiconductor devices, liquid crystal display devices, EL, LED display elements, thermosensitive head elements, and various other kinds of small precise sensor devices.

According to the first aspect of this invention, it is possible to provide a bonding method and apparatus with which a very reliable bonding can be performed without peeling of the surface of a bonded portion and fluctuation of the connection strength. Further, with this bonding apparatus, it is possible to achieve a highly reliable bonding even when the lead wire material and surface condition are changed and it is also possible to minimize abnormal friction between the bonding tool and the capillary tube, thus improving the durability of the bonding tool.

According to the second aspect of this invention, it is possible to provide a testing method and apparatus with which the bonding portion can be tested accurately after bonding in a short time in a non-contact manner without any damage to the product and which enables the realization of easy quality control and hence a very reliable bonding. Furthermore, it is possible to provide electronic elements which, during use, are free from either lowering of functionality due to any connection resistance increase of the bonding portion or from becoming unusable due to any breakage of the lead wire.

What is claimed is:

1. A bonding apparatus comprising:
   a bonding tool and
   means for driving said bonding tool
   means for detecting an amount of crushing of a bonding portion during bonding;
   means for calculating a rate of change of the amount of crushing detected by said amount-of-crushing detecting means;
   means for setting a target value, which is inputted from an external source, of a target amount of crushing of the bonding portion; and
   means for controlling said driving means, said controlling means being capable of comparing the amount of crushing detected by said amount-of-crushing detecting means with the target value when the rate of change of the amount of crushing calculated by said calculating means is equal to or smaller than a predetermined value and also capable of discriminating, when the amount of crushing detected by said amount-of-crushing detecting means is smaller than the target value, that the bonding is being performed in a satisfactory manner and should be continued.

2. A bonding apparatus as defined in claim 1, wherein when the amount of crushing detected by said amount-of-crushing detecting means is larger than the target value set in said target value setting means, said controlling means is capable of instructing said driving means to stop driving to thereby stop the bonding.

3. A bonding apparatus comprising:
   a bonding tool and
   means for driving said bonding tool
   means for detecting an amount of crushing of a bonding portion during bonding;
   means for calculating a rate of change of the amount of crushing detected by said amount-of-crushing detecting means;
   means for setting a target value, which is inputted from an external source, of the amount of crushing of the bonding portion; and
   means for controlling said driving means, said controlling means being capable of comparing the amount of crushing detected by said amount-of-crushing detecting means with the target value when the rate of change of the amount of crushing calculated by said calculating means is equal to or smaller than a predetermined value and also capable of discriminating, when the amount of crushing detected by said amount-of-crushing detecting means is smaller than the target value, that the bonding is being performed in a satisfactory manner and should be continued,
   wherein said driving means further comprises an ultrasonic oscillator for vibrating said bonding tool ultrasonically, said controlling means being operable, when the amount of crushing detected by said amount-of-crushing detecting means is smaller than the target value set in said target value setting means, to instruct said ultrasonic oscillator to increase its output.

4. A bonding apparatus comprising:
   a bonding tool and
   means for driving said bonding tool
   means for detecting an amount of crushing of a bonding portion during bonding;
   means for calculating a rate of change of the amount of crushing detected by said amount-of-crushing detecting means;
   means for setting a target value, which is inputted from an external source, of the amount of crushing of the bonding portion; and
   means for controlling said driving means, said controlling means being capable of comparing the amount of crushing detected by said amount-of-crushing detecting means with the target value when the rate of change of the amount of crushing calculated by said calculating means is equal to or smaller than a predetermined value and also capable of discriminating, when the amount of crushing detected by said amount-of-crushing detecting means is smaller than the target value, that the bonding is being performed in a satisfactory manner and should be continued, wherein said bonding tool has a through-hole adapted to open at one end to the bonding portion to be bonded, said detecting means comprising means for radiating light from the one end of said through-hole to the bonding portion to be bonded and for receiving light reflected therefrom and means for detecting any deformation of the bonding portion being bonded.

5. A bonding apparatus comprising:

a bonding tool and means for driving said bonding tool means for detecting an amount of crushing of a bonding portion during bonding;

means for setting a target value, which is inputted from an external source, of the amount of crushing of the bonding portion;

means for setting an arbitrary value as a bonding time, which is inputted from an external source, from starting the bonding until the amount of crushing detected by said amount-of-crushing detecting means reaches the target value; and means for controlling said driving means, said controlling means being capable of discriminating a time point within the bonding time, which is stored in said time setting means, as a discriminating time point according to a first predetermined relationship and also capable of discriminating, according to a second predetermined relationship, the amount of crushing, which is smaller than the target value, as an amount of crushing to be discriminated and further capable of comparing the amount of crushing, which is detected by said amount-of-crushing detecting means at the discriminating time point, with the amount of crushing to be discriminated and discriminating, when the amount of crushing detected by said amount-of-crushing detecting means is smaller than the amount of crushing to be discriminated, that the bonding is being performed in a satisfactory manner and should be continued.

6. A bonding apparatus as defined in claim 5, wherein at the discriminating time point, when the amount of crushing detected by said amount-of-crushing detecting means is larger than the amount of crushing to be discriminated, said controlling means is capable of instructing said driving means to stop driving to thereby stop the bonding.

7. A bonding apparatus comprising:

a bonding tool and means for driving said bonding tool means for detecting an amount of crushing of a bonding portion during bonding;

means for setting a target value, which is inputted from an external source, of the amount of crushing of the bonding portion;

means for setting an arbitrary value as a bonding time, which is inputted from an external source, from starting the bonding until the amount of crushing detected by said amount-of-crushing detecting means reaches the target value; and means for controlling said driving means, said controlling means being capable of discriminating a time point within the bonding time, which is stored in said time setting means, as a discriminating time point according to a first predetermined relationship and also capable of discriminating, according to a second predetermined relationship, the amount of crushing, which is smaller than the target value, as an amount of crushing to be discriminated, and further capable of comparing the amount of crushing, which is detected by said amount-of-crushing detecting means at the discriminating time point, with the amount of crushing to be discriminated and discriminating, when the amount of crushing detected by said amount-of-crushing detecting means is smaller than the amount of crushing to be discriminated, that the bonding is being performed in a satisfactory manner and should be continued, wherein said driving means includes an ultrasonic oscillator for vibrating said bonding tool ultrasonically, and wherein at the discriminating time point, when the amount of crushing detected by said amount-of-crushing detecting means is smaller than the amount of crushing to be discriminated, said controlling means being operable, when the amount of crushing detected by said amount-of-crushing detecting means is smaller than the target value set in said target value setting means, to instruct said ultrasonic oscillator to increase its output.

8. A bonding apparatus comprising:

a bonding tool and means for driving said bonding tool means for detecting an amount of crushing of a bonding portion during bonding;

means for setting a target value, which is inputted from an external source, of the amount of crushing of the bonding portion;

means for setting an arbitrary value as a bonding time, which is inputted from an external source, from starting the bonding until the amount of crushing detected by said amount-of-crushing detecting means reaches the target value; and means for controlling said driving means, said controlling means being capable of discriminating a time point within the bonding time, which is stored in said time setting means, as a discriminating time point according to a first predetermined relationship and also capable of discriminating, according to a second predetermined relationship, the amount of crushing, which is smaller than the target value, as an amount of crushing to be discriminated, and further capable of comparing the amount of crushing, which is detected by said amount-of-crushing detecting means at the discriminating time point, with the amount of crushing to be discriminated and discriminating, when the amount of crushing detected by said amount-of-crushing detecting means is smaller than the amount of crushing to be discriminated, that the bonding is being performed in a satisfactory manner and should be continued, wherein said bonding tool has a through-hole adapted to open at one end to the bonding portion to be bonded, said detecting means including means for radiating light from the one end of said through-hole to the bonding portion to be bonded and for receiving light reflected therefrom and means for detecting any change of bonding portion being bonded.

9. A method of bonding a bonding portion while applying ultrasonic vibration thereto, comprising the steps of:

detecting an amount of crushing of the bonding portion during the bonding;

comparing, when a rate of change of the detected amount of crushing is equal to or smaller than a predetermined constant value, the detected amount of crushing with a predetermined target value; and discriminating, when the detected amount of crushing is equal to or smaller than the target value, that the bonding is being performed in a satisfactory manner and should be continued.

10. A bonding method as defined in claim 9, wherein the bonding is continued while applying a lowered output of ultrasonic vibration to the bonding portion.

* * * * *